United States Patent
Lin et al.

(10) Patent No.: US 9,008,206 B2
(45) Date of Patent: Apr. 14, 2015

(54) RECEIVING APPARATUS WITH A SINGLE SET OF CHANNELS FOR PROCESSING PLURAL SETS OF IN-PHASE AND QUADRATURE PHASE SIGNALS

(75) Inventors: Ying-His Lin, Hsinchu (TW); Yi-Shao Chang, Linyuan Township, Kaohsiung County (TW); Yi-Chang Shih, Hsinchu (TW)

(73) Assignee: Realtek Semiconductor Corp., Hsinchu (TW)

( * ) Notice: Subject to any disclaimer, the term of this patent is extended or adjusted under 35 U.S.C. 154(b) by 367 days.

(21) Appl. No.: 13/219,259

(22) Filed: Aug. 26, 2011

(65) Prior Publication Data

US 2012/0051461 A1    Mar. 1, 2012

(30) Foreign Application Priority Data

Aug. 27, 2010  (TW) ................................ 99128844 A

(51) Int. Cl.
*H04B 7/02* (2006.01)
*H03D 7/16* (2006.01)
*H04B 1/30* (2006.01)
*H04L 27/26* (2006.01)

(52) U.S. Cl.
CPC ...... *H03D 7/165* (2013.01); *H04B 1/30* (2013.01); *H04L 27/2647* (2013.01)

(58) Field of Classification Search
CPC .... H04B 1/30; H04L 1/0618; H04L 27/2647; H04L 27/2332
USPC .......................................... 375/316; 455/130
See application file for complete search history.

(56) References Cited

U.S. PATENT DOCUMENTS

| 6,438,177 | B1 | 8/2002 | Ikeda | |
|---|---|---|---|---|
| 7,729,455 | B2 * | 6/2010 | Mizukami | 375/329 |
| 7,907,555 | B1 * | 3/2011 | Sankabathula et al. | 370/284 |
| 2007/0080843 | A1 * | 4/2007 | Lee et al. | 341/155 |
| 2010/0002670 | A1 * | 1/2010 | Dent | 370/342 |

(Continued)

FOREIGN PATENT DOCUMENTS

| CN | 1398092 A | 2/2003 |
|---|---|---|
| CN | 101527564 A | 9/2009 |
| TW | 200822581 A | 5/2008 |

OTHER PUBLICATIONS

English Abstract translation of CN1398092 (Published Feb. 19, 2003).

(Continued)

*Primary Examiner* — Leon-Viet Nguyen
(74) *Attorney, Agent, or Firm* — McClure, Qualey & Rodack, LLP

(57) ABSTRACT

The present invention relates to a receiving apparatus of a communication system, which comprises a receiving module, a selection unit, and a processing module. The receiving module receives an input signal and produces a first signal and a second signal. The phases of the first and the second signals are different. The selection unit receives the first and the second signals, and switches for outputting the first or the second signal. The processing module receives and processes the first and the second signals, and produces an output signal. Thereby, the present invention uses the selection unit for processing two phase signals via a set of channels. Thereby, circuit area and power consumption can be reduced, and hence achieving the purpose of saving cost.

15 Claims, 8 Drawing Sheets

(56) References Cited

U.S. PATENT DOCUMENTS

| | | | |
|---|---|---|---|
| 2010/0246995 A1* | 9/2010 | Paulus et al. | 382/275 |
| 2010/0254475 A1* | 10/2010 | Kawauchi et al. | 375/267 |
| 2011/0032685 A1* | 2/2011 | Akiba et al. | 361/782 |

OTHER PUBLICATIONS

English Abstract translation of TW200822581 (Published May 16, 2008).

English Abstract translation of CN101527564 (Published Sep. 9, 2009).

* cited by examiner

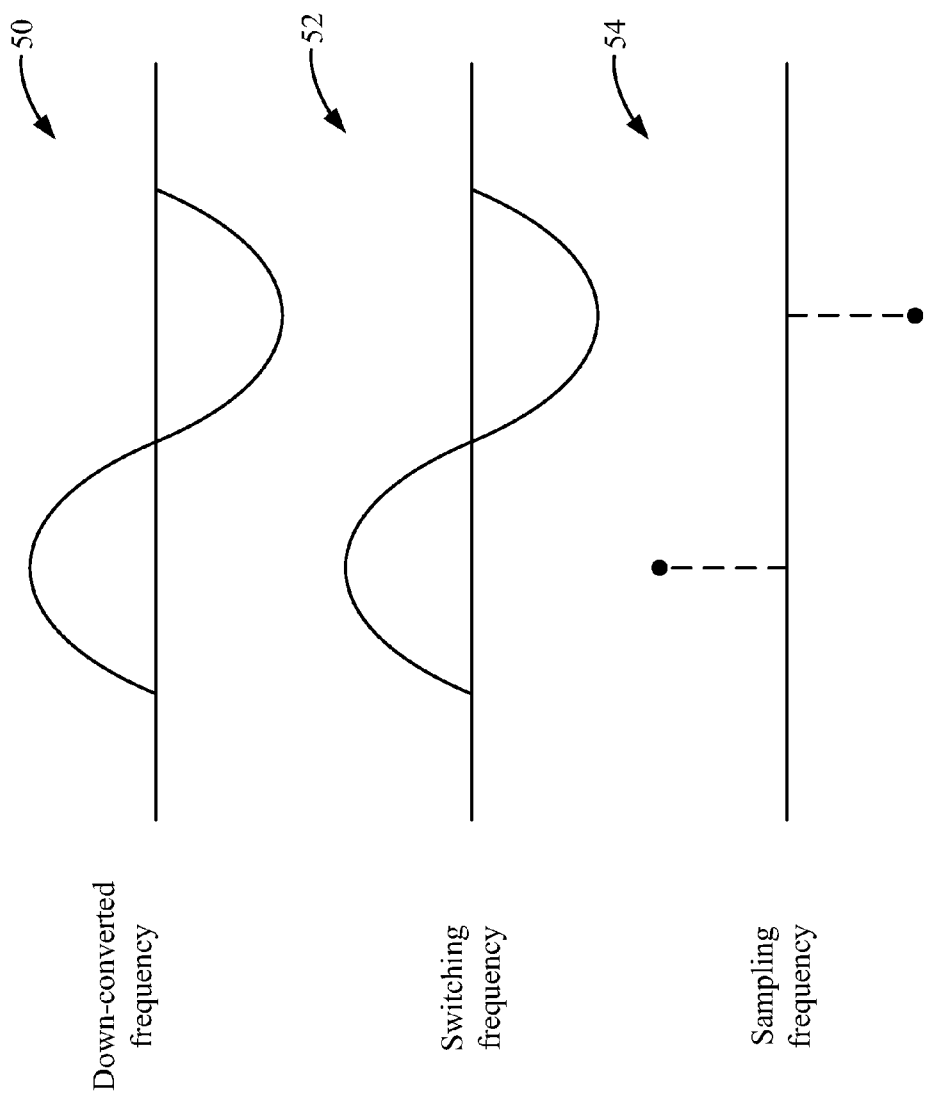

RECEIVING APPARATUS WITH A SINGLE SET OF CHANNELS FOR PROCESSING PLURAL SETS OF IN-PHASE AND QUADRATURE PHASE SIGNALS

FIELD OF THE INVENTION

The present invention relates generally to a receiving apparatus, and particularly to a receiving apparatus of a communication system.

BACKGROUND OF THE INVENTION

In the radio-frequency (RF) transmission architectures of modern wireless communication systems, there are two mainstreams of receiver architectures that are highly integrated as well as providing multiple modes. One is the low intermediate frequency (IF) receiver; the other is the direct conversion, or zero IF, receiver. These two types of receivers own complementary pros and cons, and are extensively valued and applied in the industry. The former receiver can avoid problems of DC shifts and low-frequency noises. However, it suffers from interferences by image signals. On the contrary, the latter receiver has little interferences by image signals. Nevertheless, it has the problems of DC shifts and low-frequency noises.

At present, low- and intermediate-frequency architectures are widely applied to transmitting and receiving sides of wireless communication. Thereby, the problems of image interference and circuit areas in low- and intermediate-frequency receiver architectures have become a major issue in the industry as well as in the academia. The most popular method is, in a low- and intermediate-frequency or an ultra-low- and intermediate-frequency receiver architecture, to use a mixing circuit to down-convert the wireless RF signal received by an antenna and output a pair of orthogonal signals. A complex filter architecture is then used for processing the pair of signals. Starting from the output of a low noise amplifier (LNA) in a general image rejection receiver architecture, passing mixers, filters, amplifiers, analog-to-digital converters, and till the output of a baseband processing circuit, signals are divided into two phases, namely, 0-degree (in-phase, I) and 90-degree (quadrature, Q) signals. Consequently, two sets of mixers, filters, amplifiers, and analog-to-digital converters are required, hence consuming more circuit area and power consumption as well as widening asymmetry between I and Q signals.

Accordingly, the present invention provides a novel receiving apparatus of a communication system, which can avoid using two sets of amplifiers and analog-to-digital converters. Thereby, circuit area and power consumption can be reduced, and the problems described above can be solved.

SUMMARY

An objective of the present invention is to provide a receiving apparatus of a communication system, which uses only a set of channels for processing in-phase and the quadrature signals. Thereby, circuit area and power consumption can be reduced, and hence achieving the purpose of saving cost.

Another objective of the present invention is to provide a receiving apparatus of a communication system, which uses an image rejection filter for eliminating image interferences between the two signals with different phases.

Still another objective of the present invention is to provide a receiving apparatus of a communication system, which adjusts the ratio of the down-converted frequency of a mixer to a switching frequency for reducing power consumption of the receiving apparatus, and hence achieving the purpose of saving power.

The receiving apparatus of a communication system according to the present invention comprises a receiving module, a selection unit, and a processing module. The receiving module receives an input signal and produces a first signal and a second signal. The phases of the first and the second signals are different. The selection unit receives the first and the second signals, and switches for outputting the first or the second signal. The processing module receives and processes the first and the second signals, and produces an output signal. Thereby, the present invention uses the selection unit for switching outputting the first or the second signal to the processing module via a set of channels. Thereby, circuit area and power consumption can be reduced, and hence achieving the purpose of saving cost.

In addition, the processing module produces a selection signal and transmits the selection signal to the selection unit for controlling the selection unit to switch outputting the first or the second signal.

BRIEF DESCRIPTION OF THE DRAWINGS

FIG. 3A shows waveforms of the down-converted frequency, switching frequency, and sampling frequency according to a preferred embodiment of the present invention;

DETAILED DESCRIPTION

In order to make the structure and characteristics as well as the effectiveness of the present invention to be further understood and recognized, the detailed description of the present invention is provided as follows along with embodiments and accompanying figures.

Figure 1:
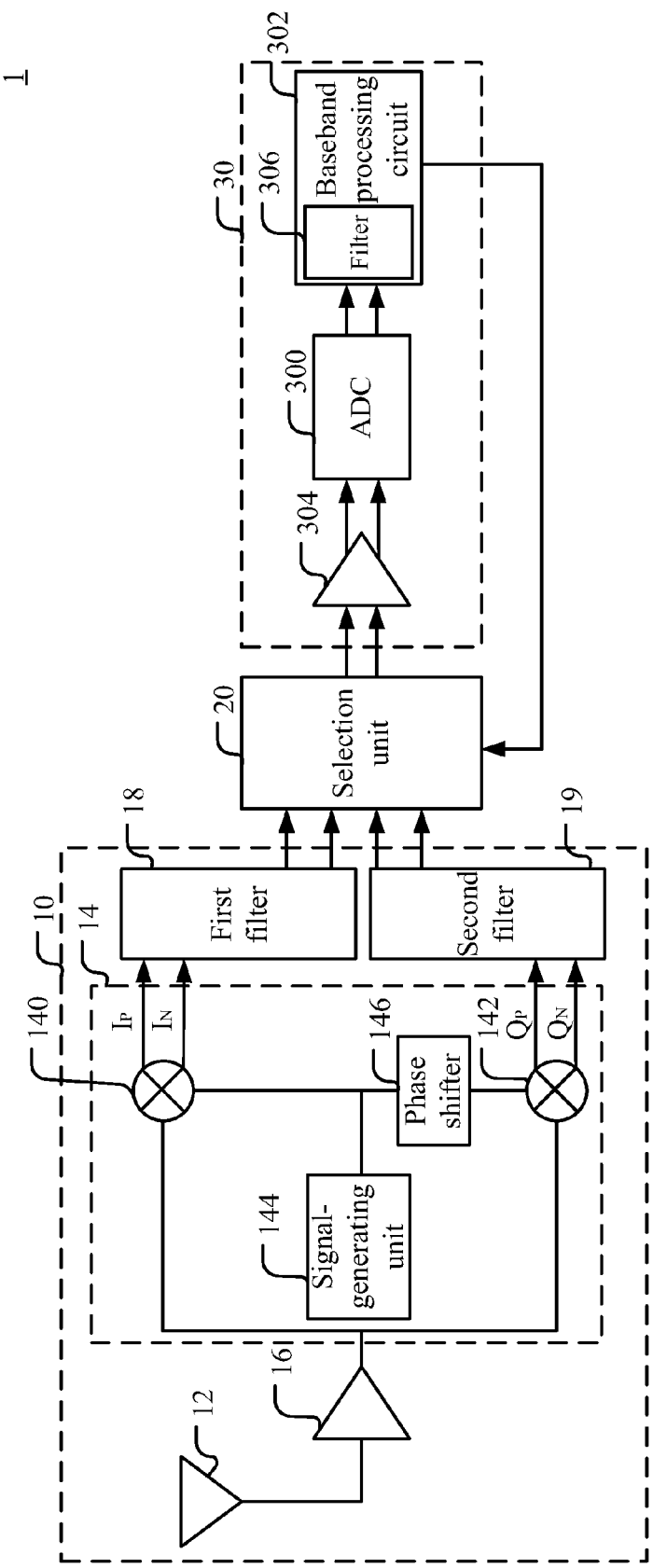
FIG. 1 shows a block diagram according to a preferred embodiment of the present invention.

FIG. 1 shows a block diagram according to a preferred embodiment of the present invention. As shown in the figure, the receiving apparatus 1 of a communication system according to the present invention comprises a receiving module 10, a selection unit 20, and a processing module 30. The receiving module 10 receives an input signal and produces a first signal and a second signal. In other words, the receiving module 10 receives a wireless RF signal as the input signal and produces the first and the second signals. The first signal comprises a first in-phase signal $I_P$ and a second in-phase signal $I_N$, where the first in-phase signal $I_P$ differs second in-phase signal $I_N$ by 180 degrees and forming a set of difference signals. The second signal comprises a first quadrature-phase signal $Q_P$ and a second quadrature-phase signal $Q_N$, where the first quadrature-phase signal $Q_P$ differs second quadrature-phase signal $Q_N$ by 180 degrees and forming a set of difference signals. Besides, the phases of the first and the second signals are different. According to the present embodiment, the phase difference between the first and the second signals is 90 degrees; the phase difference between the first in-phase signal $I_P$ and the first quadrature-phase signal $Q_P$ is 90 degrees; and the phase difference between the second in-phase signal $I_N$ and the second quadrature-phase signal $Q_N$ is 90 degrees.

The selection unit 20 is coupled to the receiving module 10 and receives the first and the second signals. The selection unit 20 switches outputting the first or the second signal. That is to say, the selection unit 20 firstly outputs the first signal, and then outputs the second signal the next time for subsequent processes by the processing module 30. The processing module 30 is coupled to the selection unit 20 and receives the first and the second signals sequentially. In addition, the processing module 30 processes the first and the second signals and produces an output signal. The processing module produces a selection signal and transmits the selection signal to the selection unit 20 for controlling the selection unit 20 to switch outputting the first or the second signal. Namely, the processing module 30 produces the selection signal according to a switching frequency, and transmits the selection signal to the selection unit 20 for controlling the selection unit 20 to output the frequencies of the first and the second signals. Thereby, the processing module 30 can correctly receive the first and the second signals according to the switching frequency for further processes. According to the present invention, the selection unit 20 is used for switching outputting the first or the second signal. The selection unit 20 outputs a set of in-phase signals ($I_P$, $I_N$) or quadrature-phase signals ($Q_P$, $Q_N$) at a time, and thus achieving using only one set of channels for transmitting and processing two sets of in-phase and quadrature-phase signals. Accordingly, circuit area and power consumption can be reduced, and hence achieving the purpose of saving cost.

The receiving module 10 according to the present invention comprises an antenna 12 and a mixing circuit 14. The antenna 12 receives the wireless RF signal as the input signal. The mixing circuit 14 is coupled to the antenna 12 and receives the input signal received by the antenna 12. Besides, the mixing circuit 14 mixes the input signal with at least a mixing signal and produces the first in-phase signal $I_P$, the first quadrature-phase signal $Q_P$, the second in-phase signal $I_N$, and the second quadrature-phase signal $Q_N$. The mixing circuit 14 comprises a first mixer 140 and a second mixer 142. The first mixer 140 mixes the input signal with a first mixing signal according to a down-converted frequency and produces the first signal; the second mixer 142 mixes the input signal with a second mixing signal according to the down-converted frequency and produces the second signal. The phases of the first and the second mixing signals are different. According to the present embodiment, the phase difference therebetween is 90 degrees. Thereby, the phases of the first and the second signals differ by 90 degrees.

In addition, the mixing circuit 14 according to the present invention further comprises a signal-generating unit 144 and a phase shifter 146. The signal-generating unit 144 is used for producing the first mixing signal. The phase shifter 146 is coupled to the signal-generating unit 144 for receiving and shifting the phase of the first mixing signal. Then, the phase shifter 146 transmits the second mixing signal to the second mixer 142 to make the phases of the first and the second mixing signals different. The signal-generating unit 144 transmits the first mixing signal to the first mixer 140. The phase shifter 146 transmits the second mixing signal to the second mixer 142. According to the present embodiment, the phase shifter 146 is coupled between the signal-generating unit 144 and the second mixer 142 for shifting the phase of the first mixing signal and thus making the phases of the first the second mixing signals differ by 90 degrees. Likewise, the phase shifter 146 can also be coupled between the signal-generating unit 144 and the first mixer 140 (not shown in the figure). The signal-generating unit 144 is a voltage-controlled oscillator (VCO). Because the mixing circuit 14 described above is well known to a person having ordinary skill in the art, its details will not be described further.

Moreover, the receiving module 10 according to the present invention further comprises an amplifier 16, a first filter 18, and a second filter 19. The amplifier 16 is used for amplifying the input signal and transmitting the amplified input signal to the mixing circuit 14. The amplifier 16 is a low noise amplifier (LNA). The first filter 18 and the second filter 19 are coupled to the mixing circuit 14 for filtering the first and the second signals, respectively, and transmitting the filtered first and second signals to the processing module 30. The first and the second filters 18, 19 are general filters. Because the filters described above are well known to a person having ordinary skill in the art, their details will not be described further.

The processing module 30 according to the present invention comprises an analog-to-digital conversion unit 300 and a baseband processing circuit 302. The analog-to-digital conversion unit 300 is coupled to the selection unit 20 and converts the first or the second signal to a digital signal. The baseband processing circuit 302 is coupled to the analog-to-digital conversion unit 300 and process the digital signal produced by the analog-to-digital conversion unit 300 and thus producing the output signal. Meanwhile, the baseband processing circuit 302 produces the selection signal according to the switching frequency and transmits the selection signal to the selection unit 20 for controlling the switching frequency of the selection unit 20.

The processing module 30 further comprises an amplifier 304, which is coupled between the selection unit 20 and the analog-to-digital conversion unit 300 for amplifying and transmitting the first and the second signals to the baseband processing circuit 302.

In addition, the processing module 30 further comprises a filter 306, which is disposed in the baseband processing circuit 302 for filtering the image interference in the digital signal output by the analog-to-digital conversion unit 300. The filter 306 receives the first in-phase signal $I_P$, the first quadrature-phase signal $Q_P$, the second in-phase signal $I_N$, and the second quadrature-phase signal $Q_N$ and filters the image interference therein. Namely, the image interference in the first and the second signals is filtered by the filter 306, which is an image rejection filter.

Figure 2:
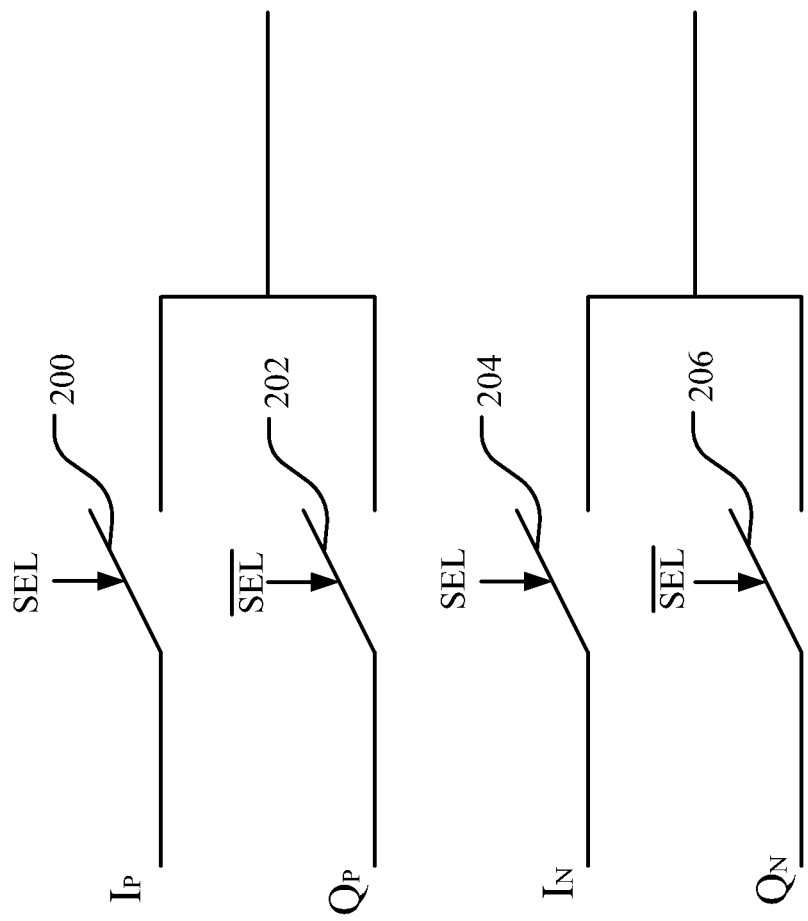
FIG. 2 shows a circuit diagram of a selection unit according to a preferred embodiment of the present invention.

FIG. 2 shows a circuit diagram of a selection unit according to a preferred embodiment of the present invention. As shown in the figure, because the first signal comprises the first in-phase signal $I_P$ and the second in-phase signal $I_N$, and the second signal comprises the first quadrature-phase signal $Q_P$ and the second quadrature-phase signal $Q_N$, the selection unit 20 according to the present invention comprises a first switch 200, a second switch 202, a third switch 204, and a fourth switch 206. The first switch 200 receives the first in-phase signal $I_P$; the second switch 202 receives the first quadrature-phase signal $Q_P$; the third switch 204 receives the second in-phase signal $I_N$; and the fourth switch 206 receives the second quadrature-phase signal $Q_N$. The selection unit 20 can switch outputting the first in-phase signal $I_P$ and the second in-phase signal $I_N$, or the first quadrature-phase signal $Q_P$ and the second quadrature-phase signal $Q_N$ sequentially according to the selection signal. According to the present embodiment, the output of the second switch 202 is coupled to the output of the first switch 200 for forming a first switching module; the output of the fourth switch 206 is coupled to the output of the third switch 204 for forming a second switching module. The first, the second, the third, and the fourth switches 200, 202, 204, 206 are controlled by the selection signal, so that the selection unit 20 can switch outputting a set of in-phase signals or a set of quadrature-phase signals sequentially according to the selection signal. In other words, the selection unit 20 outputs the first and the second signals sequentially via the first and the second switching modules. The selection signal comprises a first clock signal SEL and a second clock signal $\overline{SEL}$, which are the inverses of the other. The first switch 200 and the second switch 202 are controlled by the first clock signal SEL and the second click signal $\overline{SEL}$, respectively; the third switch 204 and the fourth switch 206 are controlled by the first clock signal SEL and the second click signal $\overline{SEL}$, respectively. Thereby, the selection unit 20 outputs a set of in-phase signals or a set of quadrature-phase signals according to the first clock signal SEL and the second click signal $\overline{SEL}$ of the selection signal. Consequently, when the first clock signal SEL closes the first and the third switches 200, 204 and the second clock signal $\overline{SEL}$ opens the second and the fourth switches 202, 206, the selection unit 20 output the first in-phase signal $I_P$ and the second in-phase signal $I_N$. On the contrary, when the first clock signal SEL opens the first and the third switches 200, 204 and the second clock signal $\overline{SEL}$ closes the second and the fourth switches 202, 206, the selection unit 20 output the first quadrature-phase signal $Q_P$ and the second quadrature-phase signal $Q_N$. Thereby, by using the selection unit 20, circuit area and power consumption can be reduced, and thus the purpose of saving cost can be achieved.

FIGS. 3A to 3D show waveforms of the down-converted frequency, switching frequency, and sampling frequency according to preferred embodiments of the present invention. As shown in the figures, the analog-to-digital conversion unit 300 samples the first or the second signal output by the selection unit 20 according to a sampling frequency and converts it to a digital signal. According to the sampling theorem of analog-to-digital conversion, at least two samples are required in a period of a signal. Namely, the sampling frequency of the analog-to-digital conversion unit 300 depends on the frequency of the first or the second signal output by the selection unit 20. When the down-converted frequency of the mixers 140, 142 maintains a ratio to the switching frequency of the selection unit 20 and the switching frequency is greater than the down-converted frequency, the sampling frequency of the analog-to-digital conversion unit 300 can be reduced, which, in turn, reduces the power consumption of the receiving apparatus 1 and hence achieving the purpose of saving power.

Figure 3B:
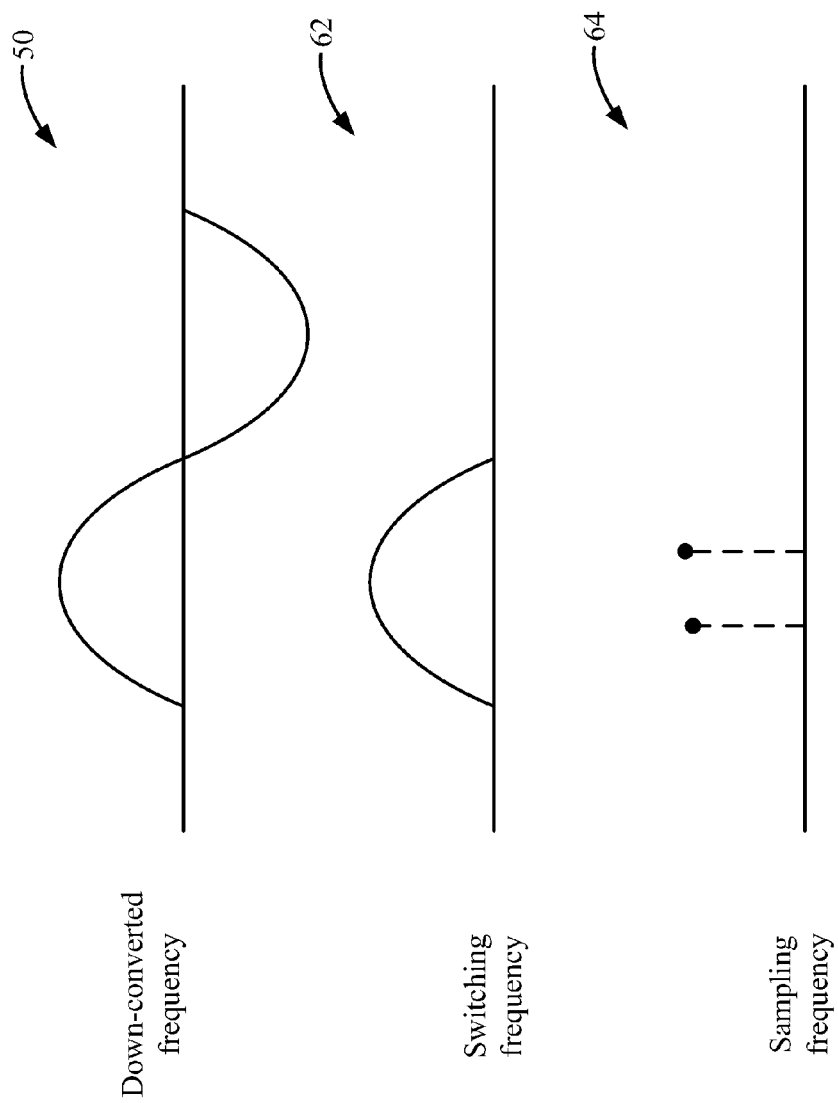
FIG. 3B shows waveforms of the down-converted frequency, switching frequency, and sampling frequency according to another preferred embodiment of the present invention.
Figure 3C:
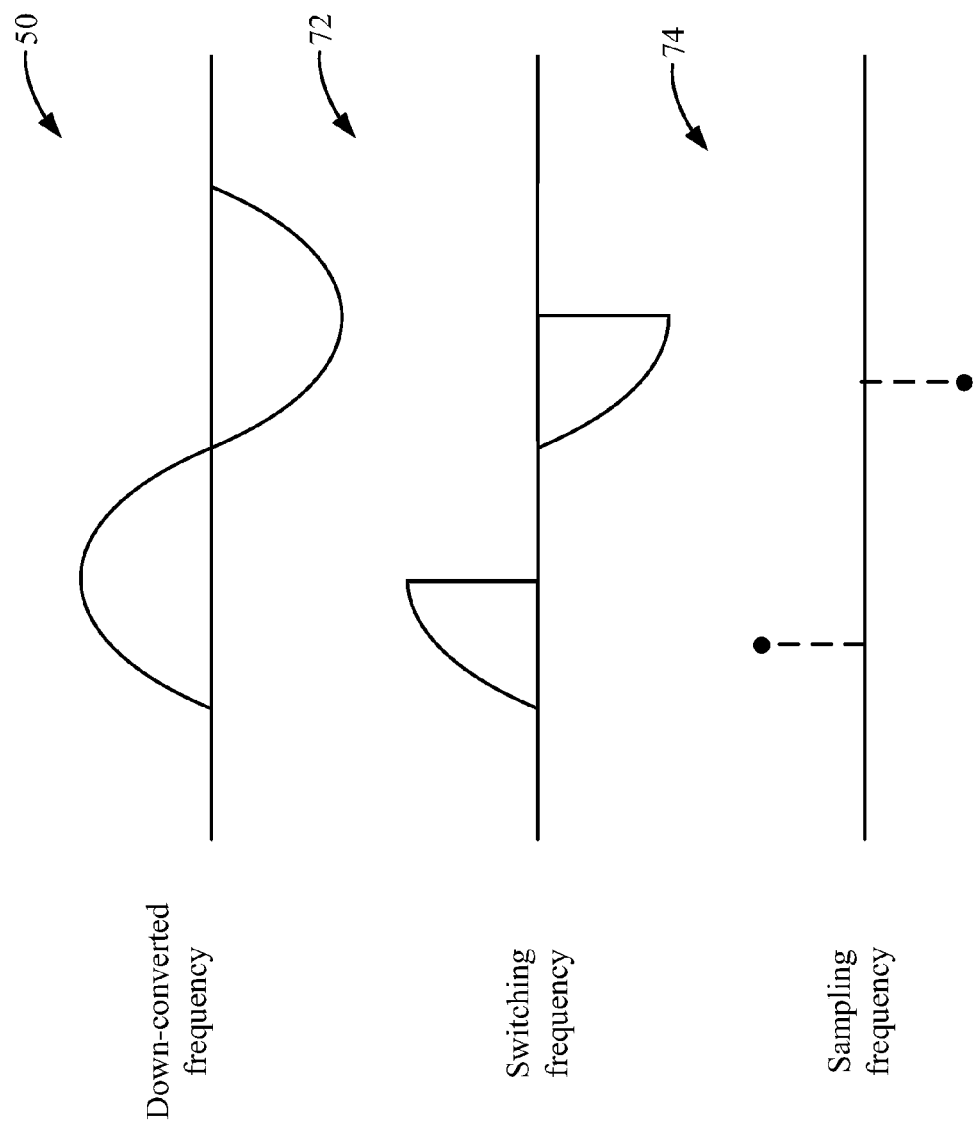
FIG. 3C shows waveforms of the down-converted frequency, switching frequency, and sampling frequency according to another preferred embodiment of the present invention.

As shown in FIGS. 3A to 3D, the waveform of the first in-phase signal $I_P$ is used as an example. However, the present invention is not limited to the waveform of the first in-phase signal $I_P$. The waveform can also be the second in-phase signal $I_N$, the first quadrature-phase signal $Q_P$, and the second quadrature-phase signal $Q_N$. For simplicity, only the waveform of the first in-phase signal $I_P$ is used in the present embodiments. First, as shown in FIG. 3A, when the down-converted frequency of the mixers 140, 142 is 2.5 MHz, the switching frequency of the selection unit 20 is 2.5 MHz, and the waveform of the first in-phase signal $I_P$ output by the first mixer 140 is a sine wave 50, the selection unit 20 produces a switching waveform 52 according to the first in-phase signal $I_P$ output by the switching frequency, as shown in FIG. 3A. For complying with the sampling theorem, the sampling frequency of the analog-to-digital conversion unit 300 at least needs to be 5 MHz. The analog-to-digital conversion unit 300 produces a sampling waveform 54 according to the sampling frequency, as shown in FIG. 3A. For simplicity, only the sampling points of corresponding to the first in-phase signal $I_P$ are plotted in the sampling waveform. As shown in FIG. 3B, when the switching frequency of the selection unit 20 is changed to 5 MHz and the selection unit 20 produces a switching waveform 62 according to the switching frequency, the sampling frequency of the analog-to-digital conversion unit 300 at least needs to be 10 MHz, and a sampling waveform 64 is produced according to the sampling frequency. As shown in FIG. 3C, when the switching frequency of the selection unit 20 is changed to 10 MHz and the selection unit 20 produces a switching waveform 72 according to the switching frequency, the sampling frequency of the analog-to-digital conversion unit 300 at least needs to be 10 MHz, and a sampling waveform 74 is produced according to the sampling frequency.

Figure 3D:
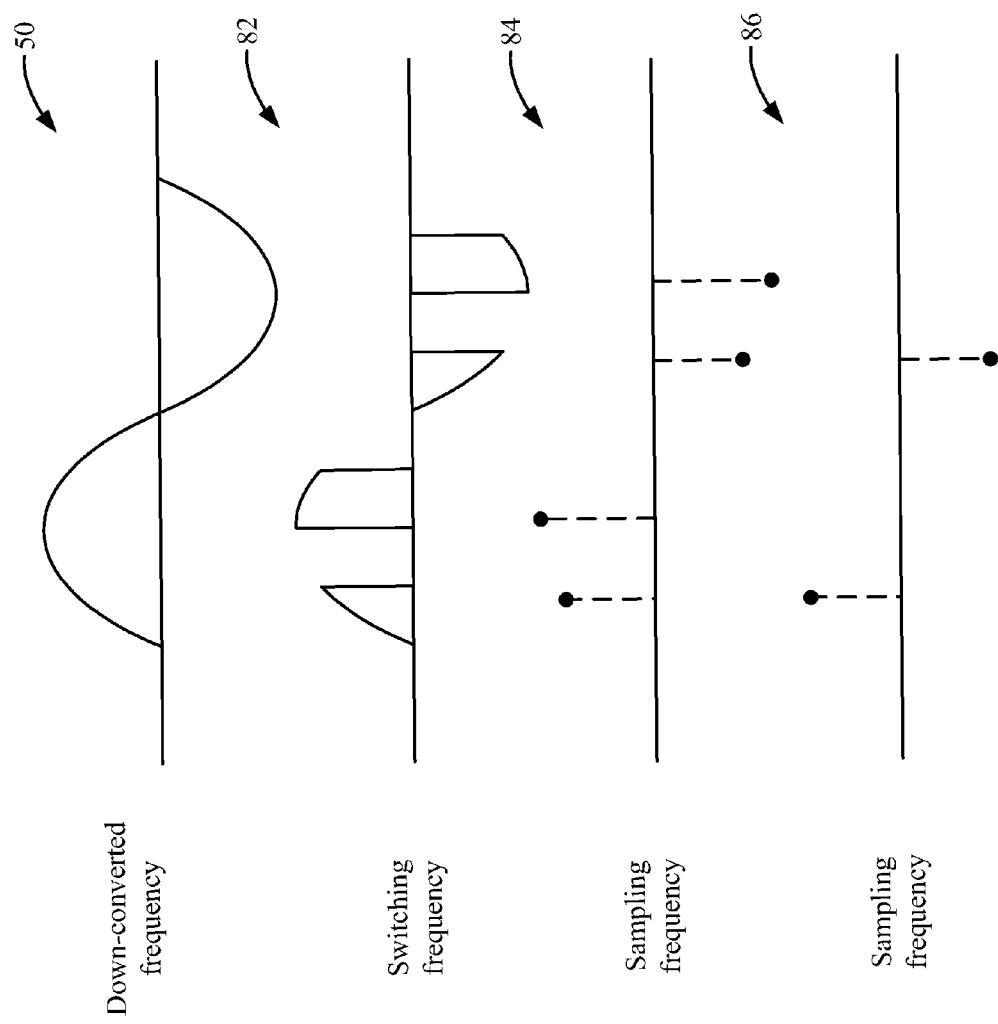
FIG. 3D shows waveforms of the down-converted frequency, switching frequency, and sampling frequency according to another preferred embodiment of the present invention.

As shown in FIG. 3D, when the switching frequency of the selection unit 20 is changed to 20 MHz and the selection unit 20 produces a switching waveform 82 according to the switching frequency, the sampling frequency of the analog-to-digital conversion unit 300 can be 20 MHz or 10 MHz, and a sampling waveform 84 or 86 is produced according to the sampling frequency. According to the sampling theorem, at least two samples are required in a period of a signal. Thereby, according to the present embodiment, the sampling frequency of the analog-to-digital conversion unit 300 can be 10 Mhz for complying with the sampling criterion. Accordingly, the power consumption of the receiving apparatus 1 is reduced, and thus achieving the purpose of saving power. Of course, the sampling frequency of the analog-to-digital conversion unit 300 can also be 20 MHz for enhancing conversion accuracy of the analog-to-digital conversion unit 300.

According to the description above, when the switching frequency is greater than the down-converted frequency and a ratio of down-converted frequency to switching frequency is greater than a first threshold value, to the switching frequency, the sampling frequency is equal to the switching frequency. As shown in FIG. 3C, when the switching frequency (10 MHz) is greater than the down-converted frequency (2.5 MHz) by 4 times, the sampling frequency can be 10 MHz. If the ratio is greater than a second threshold value, the sampling frequency should be smaller than the switching frequency. As shown in FIG. 3D, when the switching frequency (20 MHz) is greater than the down-converted frequency (2.5 MHz) by 8 times, the sampling frequency can be 10 MHz only for complying with the sampling criterion. In other words, if the ratio of the down-converted frequency to the switching frequency is an integer M and the multiples of the ratio is greater than a certain threshold value, the sampling frequency of the analog-to-digital conversion unit 300 can be reduced, which, in turn, reduces the power consumption of the receiving apparatus 1 and thus achieving the purpose of saving power. Of course, the requirement of the ratio of the down-converted frequency to the switching frequency being an integer M is only used for description. In practice, the ratio needs not be an integer.

Figure 4:
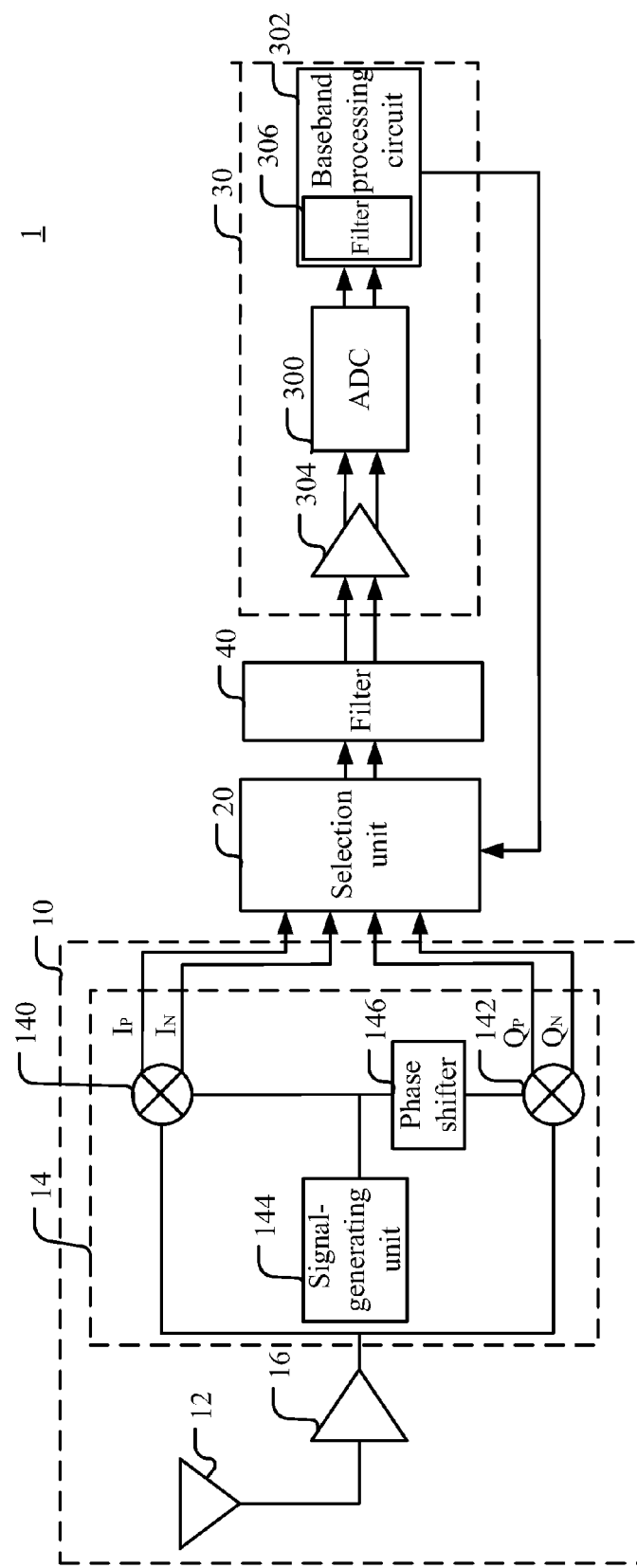
FIG. 4 shows a block diagram according to another preferred embodiment of the present invention.

FIG. 4 shows a block diagram according to another preferred embodiment of the present invention. As shown in the figure, the difference between the present embodiment and the one in FIG. 1 is that a filter 40 according to the present embodiment is coupled to the output of the selection unit 20 for filtering the first and second signals output by the selection unit 20. Because the filter 40 is disposed at the output of the selection unit 40, the filter 40 needs to filter only the first signal or the second signal. Thereby, the filter 40 according to the present embodiment can reduced the circuit area effectively, and hence reducing the overall circuit area.

Figure 5:
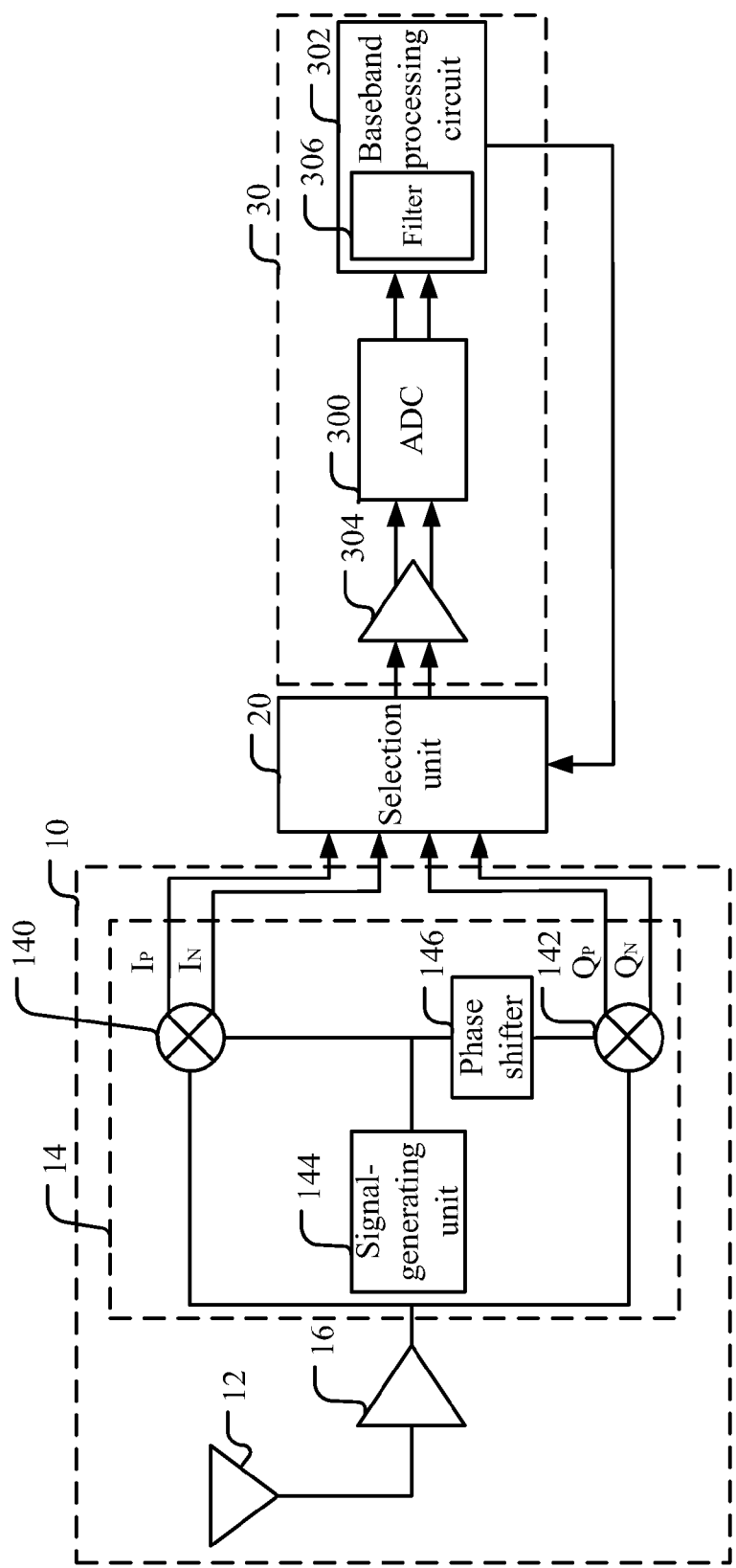
FIG. 5 shows a block diagram according to another preferred embodiment of the present invention.

FIG. 5 shows a block diagram according to another preferred embodiment of the present invention. As shown in the figure, the difference between the present embodiment and the previous one is that the receiving apparatus 1 according to the present embodiment disposes the filter 306 in the baseband processing circuit 302 only for filtering the image interference of the digital signal output by the analog-to-digital conversion unit 300, namely, filtering the image interference of the first and the second signals. Meanwhile, the noises in the first and the second signals can be filtered as well. Besides, the filter 306 is an image rejection filter.

To sum up, the receiving module of a communication system according to the present invention uses a selection unit to receive a first signal and a second signal of a switching module, and switches for outputting one of the first and the second signals to a processing module. The processing module receives and processes the first and the second signals, and produces an output signal. The processing module also produces a selection signal according to a switching frequency and transmits the selection signal to the selection unit for controlling the selection unit to switch outputting the first or the second signal. Thereby, the present invention uses the selection unit for processing two phase signals via a set of channels. Thereby, circuit area and power consumption can be reduced, and hence achieving the purpose of saving cost.

Accordingly, the present invention conforms to the legal requirements owing to its novelty, nonobviousness, and utility. However, the foregoing description is only embodiments of the present invention, not used to limit the scope and range of the present invention. Those equivalent changes or modifications made according to the shape, structure, feature, or spirit described in the claims of the present invention are included in the appended claims of the present invention.

The invention claimed is:

1. A receiving apparatus of a communication system, comprising:
a receiving module, receiving an input signal, and producing a first signal and a second signal with different phases, wherein the receiving module comprises:
an antenna, receiving the input signal; and
a mixing circuit, coupled to the antenna, mixing the input signal with at least a mixing signal according to a down-converted frequency, and producing the first signal and the second signal;
a selection unit, receiving the first signal and the second signal, and switching outputting, in succession, the first signal and the second signal, the first signal comprising a set of in-phase signals and the second signal comprising a set of quadrature phase signals; and
a processing module, receiving the first signal and the second signal sequentially, and processing the first signal and the second signal for producing an output signal, wherein the processing module produces a selection signal according to a switching frequency and transmits the selection signal to the selection unit, which switches outputting the first signal or the second signal according to the selection signal, wherein the processing module comprises an analog-to-digital conversion unit, coupled to the selection unit, converting the first signal and the second signal to a digital signal according to a sampling frequency determined by the switching frequency, wherein the switching frequency is greater than the down-converted frequency, and the switching frequency maintains a ratio to the down-converted frequency.

2. The receiving apparatus of a communication system of claim 1, wherein when the ratio is greater than a first threshold value, the sampling frequency is equal to the switching frequency.

3. The receiving apparatus of a communication system of claim 1, wherein when the ratio is greater than a second threshold value, the sampling frequency is smaller than the switching frequency.

4. The receiving apparatus of a communication system of claim 1, wherein the ratio is an integer.

5. The receiving apparatus of a communication system of claim 1, wherein the mixing circuit comprises:
a first mixer, used for mixing the input signal with a first mixing signal and producing the first signal; and
a second mixer, used for mixing the input signal with a second mixing signal and producing the second signal;
wherein the phases of the first mixing signal and the second mixing signal are different.

6. The receiving apparatus of a communication system of claim 5, wherein the mixing circuit further comprises:
a signal-generating unit, used for producing the first mixing signal and transmitting the first mixing signal to the first mixer; and
a phase shifter, coupled to the signal-generating unit, shifting the phase of the first mixing signal to produce the second mixing signal, and transmitting the second mixing signal to the second mixer.

7. The receiving apparatus of a communication system of claim 1, wherein the set for the first signal comprises a first in-phase signal and a second in-phase signal, and the set for the second signal comprises a first quadrature-phase signal and a second quadrature-phase signal.

8. The receiving apparatus of a communication system of claim 7, wherein the selection unit comprises:
a first switch, receiving the first in-phase signal;
a second switch, receiving the first quadrature-phase signal;
a third switch, receiving the second in-phase signal; and
a fourth switch, receiving the second quadrature-phase signal;
wherein the selection signal comprises a first clock signal and a second clock signal, the first clock signal is the inverse of the second clock signal, the first switch and the third switch perform switching operation according to the first clock switch, the second switch and the fourth switch perform switching operation according to the second clock signal, and the selection unit switches outputting the first signal and the second signal sequentially.

9. The receiving apparatus of a communication system of claim 1, wherein the processing module comprises:
the analog-to-digital conversion unit converting the first signal and the second signal sequentially to the digital signal; and
a baseband processing circuit, coupled to the analog-to-digital conversion unit, and processing the digital signal for producing the output signal.

10. The receiving apparatus of a communication system of claim 9, wherein the processing module further comprises an amplifier, coupled between the selection unit and the analog-to-digital conversion unit, amplifying the first signal and the second signal, and transmitting the amplified first signal and the amplified second signal to the baseband processing circuit.

11. The receiving apparatus of a communication system of claim 9, wherein the baseband processing circuit comprises an image rejection filter, receiving the digital signal, and eliminating the image effect of the digital signal.

12. A receiving method of a communication system, the method comprising:
- receiving an input signal;
- producing a first signal and a second signal with different phases based on the received input signal, the first signal comprising a set of in-phase signals and the second signal comprising a set of quadrature phase signals;
- switching outputting the first signal and the second signal sequentially; and
- processing the switch outputted first signal and the second signal to produce an output signal and a selection signal, wherein the selection signal is produced according to a switching frequency, wherein subsequent switching outputting is according to the selection signal, wherein the processing further comprises converting the switch outputted first signal and the second signal to a digital signal according to a sampling frequency determined by the switching frequency, wherein the switching frequency is greater than a down-converted frequency of the first and second signals, and the switching frequency maintains a ratio to the down-converted frequency.

13. The receiving method of claim 12, wherein when the ratio is greater than a first threshold value, the sampling frequency is equal to the switching frequency.

14. The receiving method claim 12, wherein when the ratio is greater than a second threshold value, the sampling frequency is smaller than the switching frequency.

15. The receiving method of claim 12, wherein the set for the first signal comprises a first in-phase signal and a second in-phase signal, and the set for the second signal comprises a first quadrature-phase signal and a second quadrature-phase signal.

* * * * *